(12) United States Patent
Honkura et al.

(10) Patent No.: US 8,587,300 B2
(45) Date of Patent: Nov. 19, 2013

(54) MAGNETO-IMPEDANCE SENSOR ELEMENT AND METHOD FOR PRODUCING THE SAME

(75) Inventors: Yoshinobu Honkura, Aichi (JP); Michiharu Yamamoto, Aichi (JP); Norihiko Hamada, Aichi (JP)

(73) Assignee: Aichi Steel Corporation, Tokai-shi (JP)

( * ) Notice: Subject to any disclaimer, the term of this patent is extended or adjusted under 35 U.S.C. 154(b) by 0 days.

(21) Appl. No.: 13/823,753

(22) PCT Filed: Sep. 6, 2011

(86) PCT No.: PCT/JP2011/070209
§ 371 (c)(1),
(2), (4) Date: Mar. 15, 2013

(87) PCT Pub. No.: WO2012/043160
PCT Pub. Date: Apr. 5, 2012

(65) Prior Publication Data
US 2013/0181705 A1 Jul. 18, 2013

(30) Foreign Application Priority Data
Oct. 1, 2010 (JP) .................................. 2010-223561

(51) Int. Cl.
*G01R 33/09* (2006.01)
(52) U.S. Cl.
USPC .......................................................... 324/252
(58) Field of Classification Search
USPC ......... 324/249–252, 762.01–762.1, 244, 210, 324/212; 360/31, 46, 55; 257/427
See application file for complete search history.

(56) References Cited

U.S. PATENT DOCUMENTS

| 6,232,775 B1 * | 5/2001 | Naitoh et al. ................. 324/249 |
| 8,461,834 B2 * | 6/2013 | Honkura et al. .............. 324/244 |
| 2005/0116708 A1 | 6/2005 | Honkura et al. |
| 2011/0089512 A1 | 4/2011 | Honkura et al. |

FOREIGN PATENT DOCUMENTS

| JP | 2008 134236 | 6/2008 |
| JP | 2009 300093 | 12/2009 |
| JP | 2010 16040 | 1/2010 |
| WO | 2003 071299 | 8/2003 |

OTHER PUBLICATIONS

International Search Report Issued Nov. 15, 2011 in PCT/JP11/70209 Filed Sep. 6, 2011.

* cited by examiner

*Primary Examiner* — Tung X Nguyen
(74) *Attorney, Agent, or Firm* — Oblon, Spivak, McClelland, Maier & Neustadt, L.L.P.

(57) ABSTRACT

An MI sensor element 1 includes a substrate 4 formed of a non-magnetic material, a plurality of magneto-sensitive bodies 2, and a plurality of detecting coils 3. The plurality of magneto-sensitive bodies 2 are formed of an amorphous material, and are fixed on the substrate 4, and are electrically connected to each other. The detecting coils 3 are wound around each of the magneto-sensitive bodies 2, and are electrically connected to each other. The MI sensor element 1 outputs a voltage corresponding to a magnetic field strength acting on the magneto-sensitive bodies 2 from the detecting coil 3 by flowing a pulse current or a high-frequency current to the magneto-sensitive body 2. The plurality of magneto-sensitive bodies 2 are formed by fixing one amorphous wire 20 on the substrate 4, and then cutting the wire.

6 Claims, 14 Drawing Sheets

MAGNETO-IMPEDANCE SENSOR ELEMENT AND METHOD FOR PRODUCING THE SAME

TECHNICAL FIELD

The present invention relates to a magneto-impedance sensor element having a magneto-sensitive body formed from an amorphous material, and a method for producing the same.

BACKGROUND ART

As a sensor element used in a magnetometric sensor, and the like, a magneto-impedance sensor element, which uses a magneto-sensitive body capable of changing its properties depending on an external magnetic field (hereinafter may be sometimes referred to as "MI sensor element"), are known (see Patent Documents 1 and 2 below).

As shown in FIG. 14, an MI sensor element 91 contains a substrate 94 formed of a non-magnetic material, a magneto-sensitive body 92 which is fixed on the substrate 94 and is formed of the amorphous material, and a detecting coil 93 which is wound around the magneto-sensitive body 92 through an insulator 95.

When a pulse current or a high-frequency current is made to flow into the magneto-sensitive body 92, a voltage corresponding to a magnetic field strength acting on the magneto-sensitive body 92 is output from the detecting coil 93. The magnetic field strength can be detected by measuring this voltage.

In addition, as shown in FIGS. 15 and 16, the MI sensor element 91 is also known which includes a plurality of magneto-sensitive bodies 92 and detecting coils 93 connected in series or in parallel (See Patent Document 1). When detecting coils 93 are connected in series, the strong magnetic field can be detected, and the MI sensor element 91 having a high output voltage can be obtained. In addition, a connection of detecting coils 93 in parallel can decrease a noise generated in the detecting coil 93.

PRIOR ART DOCUMENTS

Patent Documents
Patent Document 1: JP-A-2008-134236
Patent Document 2: International Publication WO 2003/71299

SUMMARY OF THE INVENTION

Problems to be Solved by the Invention

However, when the MI sensor element 91 having a plurality of magneto-sensitive bodies 92 is produced for producing an MI sensor in which detecting coils are connected in series or in parallel in order to increase an output voltage or to decrease a noise, the following problems are raised.

Thus, in order to produce an MI element having a plurality of magneto-sensitive bodies, it is necessary to prepare required amount of MI elements to be connected, which have been separately produced, to position each MI element, and to electrically connect them. Such a production is very complicated, and has a problem in which efficient production is difficult.

Further, a conventional MI element for measuring a magnetic field having a specific direction is formed in a state in which one magneto-sensitive body is formed on one substrate, and in order to connect them in series or in parallel, it is necessary to position each separate MI element and to electrically connect them. These structures have a three-dimensionally complicated electrical connection, and a problem of increased size is raised if they are used as the MI element unit for measuring the magnetic field having the specific direction.

In addition, in order to produce an MI sensor element having a plurality of magneto-sensitive bodies, a step in which MI sensor elements having one magneto-sensitive body are electrically connected to each other is indispensable. In a case using a plurality of magneto-sensitive bodies 92, however, it tends to vary property of each magneto-sensitive body 92 due to a variation in the material used for each magneto-sensitive body 92. Accordingly, a defect is caused in which variation is caused in sensitivity. Also, a magnetic field component having the same direction is measured using output voltages obtained from the detecting coils 93 wound around a plurality of magneto-sensitive bodies 92. Therefore, if all of magneto-sensitive bodies 92 are not exactly positioned to face in the same direction, each magneto-sensitive body 92 cannot measure the magnetic field component having the same direction, and thus a measuring accuracy of magnetism is lowered.

In view of the problems described above, the present invention have been made and the present invention intends to provide a method for producing a magneto-impedance element having a high production efficiency and a high measuring accuracy of magnetism, and a magneto-impedance element produced by this production method.

Means for Solving the Problems

A first invention relates to a method for producing a magneto-impedance sensor element, wherein the magneto-impedance sensor element includes a substrate formed from a non-magnetic material, a plurality of magneto-sensitive bodies, which are formed from an amorphous material, are fixed on the substrate, and are electrically connected to each other, and a plurality of detecting coils, each of which is wound around each of the magneto-sensitive bodies, and which are electrically connected to each other, and the magneto-impedance sensor element being configured to output a voltage corresponding to a magnetic field strength acting on the magneto-sensitive bodies from the detecting coils by flowing a pulse current or a high-frequency current to the magneto-sensitive bodies the method for producing the magneto-impedance sensor element including
a fixing step in which an amorphous wire is fixed on the substrate,
a cutting step in which the amorphous wire is cut to divide it in an axis line direction, thereby forming a plurality of magneto-sensitive bodies, and
a connecting step in which a plurality of magneto-sensitive bodies are electrically connected to each other.

Also a second invention relates to a magneto-impedance sensor element including
a substrate formed from a non-magnetic material,
a plurality of magneto-sensitive bodies, which are formed from an amorphous material, are fixed on the substrate, and are electrically connected to each other, and
a plurality of detecting coils, each of which is wound around each of the magneto-sensitive bodies, and which are electrically connected to each other,
wherein the magneto-impedance sensor element is configured to output a voltage corresponding to a magnetic field strength acting on the magneto-sensitive bodies from the detecting coils by flowing a pulse current or a high-frequency current to the magneto-sensitive bodies,
in which a plurality of magneto-sensitive bodies are formed by fixing one amorphous wire on the substrate, and then cutting the amorphous wire.

Effects of the Invention

Effects of the first invention will be explained. According to the method for producing the magneto-impedance sensor element according to the present invention, a plurality of magneto-sensitive bodies are formed by fixing the amorphous wire on the substrate, and then cutting it.

Thus, an exact position of each magneto-sensitive body to be connected is already decided at the time when the wire is fixed on the substrate, and then by only electrically connecting them, all of the magneto-sensitive bodies can easily be arranged in the same direction, and the MI sensor element in a parallel state can be produced. The production, therefore, can be made considerably more efficient, compared to a case in which each MI sensor element to be connected is separately prepared, each MI sensor is fixed, and then connection is further performed between wire ends and the detecting coils with an electrode pattern or wire bonding. In addition, there is no variation at all in the direction of magnetic field to be measured among the magneto-sensitive bodies, which results in the measuring accuracy of magnetism being able to be increased.

In addition, a plurality of magneto-sensitive bodies can be formed by using adjacent parts to each other in one amorphous wire. Thus, the properties of a plurality of magneto-sensitive bodies in one MI sensor element can be made almost the same. This can provide an effect in which sensitivity almost the same as the theoretical value can be obtained.

According to the present invention, after one amorphous wire is fixed on the substrate, the wire is cut. The length of the cut parts can be made remarkably minute, and production can easily be performed in a state in which magneto-sensitive bodies are very close to each other. As a result, an MI element in which a plurality of magneto-sensitive bodies are effectively positioned in a small area can easily be produced, and thus a more miniaturized MI element unit can easily be produced.

Next, effects of the second invention will be explained. As according to the present invention, after the amorphous wire is fixed on the substrate, the wire is cut to produce a plurality of magneto-sensitive bodies, the magneto-sensitive bodies can be produced by using adjacent parts to each other in the amorphous wire. This can make the properties of a plurality of magneto-sensitive bodies in one MI sensor element almost the same.

In addition, because the amorphous wire is fixed on the substrate and then the wire is cut, the magneto-sensitive bodies are arranged in the same position and direction, and positioning is performed in an exactly parallel state, at the time when the wire is fixed on the substrate. Accordingly, after that by electrical connection while the positions are maintained, an MI sensor element having no variation at all in the direction among all magneto-sensitive bodies can be easily and efficiently produced. Thus, the measuring accuracy of magnetism can be increased, similar to the first invention.

As described above, the present invention can provide the method for producing the magneto-impedance element having a high production efficiency and a high measuring accuracy of magnetism, and the magneto-impedance element produced by the production method described above.

MODE FOR CARRYING OUT THE INVENTION

Preferable embodiments in the present invention described above will be explained.

In the present invention, it is preferable that a plurality of detecting coils are connected in series to each other.

Figure 11:
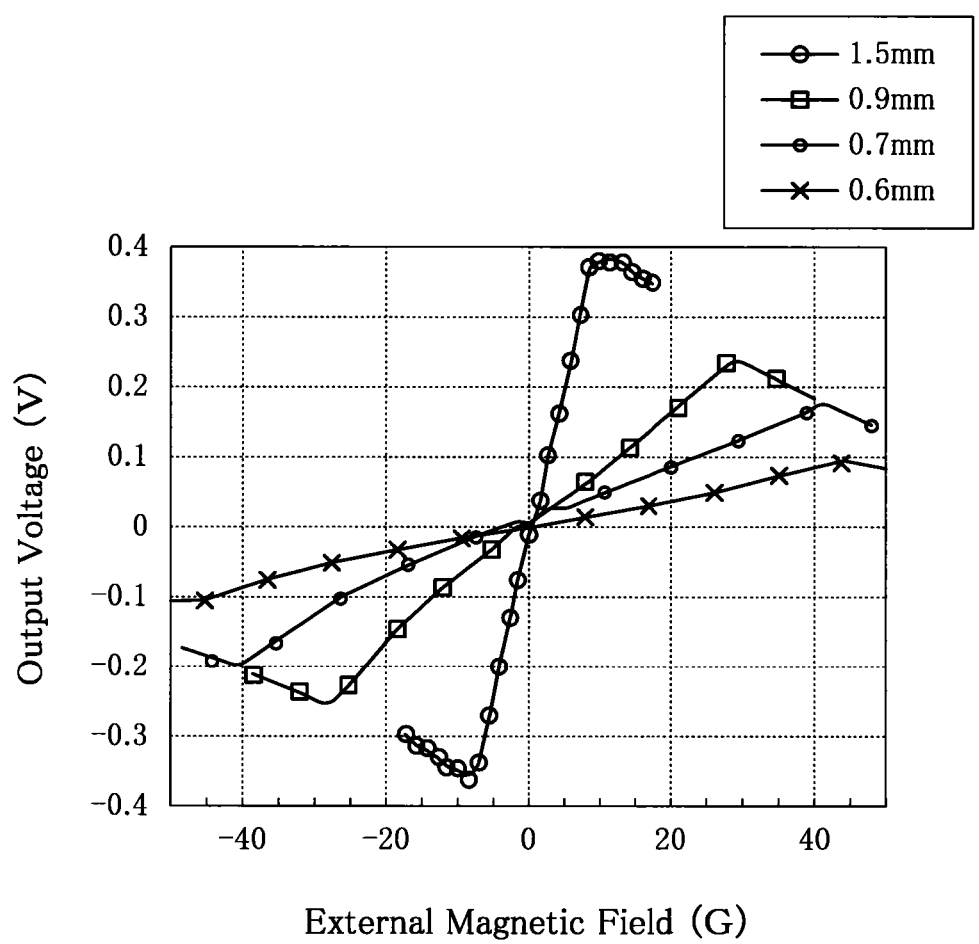
FIG. 11 is a graph showing measurement of relationships between an external magnetic field and an output voltage of a plurality of samples in which a length of the magneto-sensitive body in an axis line direction is changed in Example 1.

When the length of the magneto-sensitive body is too long in the axis line direction, a rate of change of the output voltage to change of the magnetic field strength is increased, and accordingly the output voltage is saturated even if the magnetic field is not so large (see FIG. 11). As a result, the strong magnetic field cannot be measured, and a measurable range of magnetic field strength is decreased. In order to solve this problem, it can be considered that the length of the magneto-sensitive body in the axis line direction is shortened. This makes a diamagnetizing field generated inside the magneto-sensitive body large, and thus the output voltage tends not to be saturated, and it becomes possible to detect the strong magnetic field. On the other hand, however, if the length of the magneto-sensitive body in the axis line direction is shortened, a problem of lowered output voltage is raised.

This problem can be solved by connecting a plurality of detecting coils in series so that a target output voltage can be obtained. When the amorphous wire is fixed on the substrate in advance, then several parts of the wire are cut, and the cut parts are electrically connected afterwards, as in the present invention, it can be possible to efficiently produce an MI element using a plurality of magneto-sensitive bodies and the detecting coils. Therefore, the MI sensor element capable of measuring extensive magnetic field strengths and having the high output voltage can be obtained.

In particular, when a geomagnetism is measured by the MI sensor element, there are many cases in which magnetized electronic parts are placed near a position at which the MI sensor is supposed to be fixed. In this case, it is necessary to be able to measure magnetic fields of the magnetized electronic parts, even if the objective is to measure the variation in the geomagnetism itself, and these magnetic fields have often larger magnetism than the geomagnetism. Also, because a situation of the magnetization of electronic parts varies depending on the cases, it is necessary that a measurable magnetic field strength is determined depending on such a situation, and the MI element is produced in a specification corresponding to the magnetic field strength. The present invention can be very effectively utilized for such an application.

A plurality of detecting coils described above may also be connected in parallel to each other.

This can decrease noise generated in the detecting coils. A defect in which the output voltage is hidden in noise, therefore, can be prevented, and it becomes possible to detect the magnetic field in a high accuracy.

It is also preferable that several magneto-sensitive body groups including a plurality of magneto-sensitive bodies, which are formed by cutting the one amorphous wire, and which are positioned in parallel to the axis line direction, are positioned adjacent to each other in a radial direction, and the one detecting coil is wound around a plurality of magneto-sensitive bodies which are adjacent to each other in the radial direction.

According to this structure, a plurality of magneto-sensitive bodies can be put in one detecting coil, and thus the output voltage can be increased. In addition, because distances between the magneto-sensitive bodies, which are positioned adjacent to each other in the radial direction, can be decreased, an area of the MI sensor element can be decreased.

It is also preferable that several magneto-sensitive body groups including a plurality of magneto-sensitive bodies, which are formed by cutting the one amorphous wire, and which are positioned in parallel to the axis line direction, are positioned adjacent to each other in a radial direction, and each of the detecting coil is wound around each of the magneto-sensitive body.

According to this structure, the magneto-sensitive bodies can be positioned adjacent to each other not only in the axis line direction but also in the radial direction, and thus more magneto-sensitive bodies can be formed in one MI sensor element. When the detecting coils are connected in series, therefore, the output voltage can be further increased. In addition, when the detecting coils are connected in parallel, the noise can be further decreased.

EXAMPLES

Example 1

Figure 1:
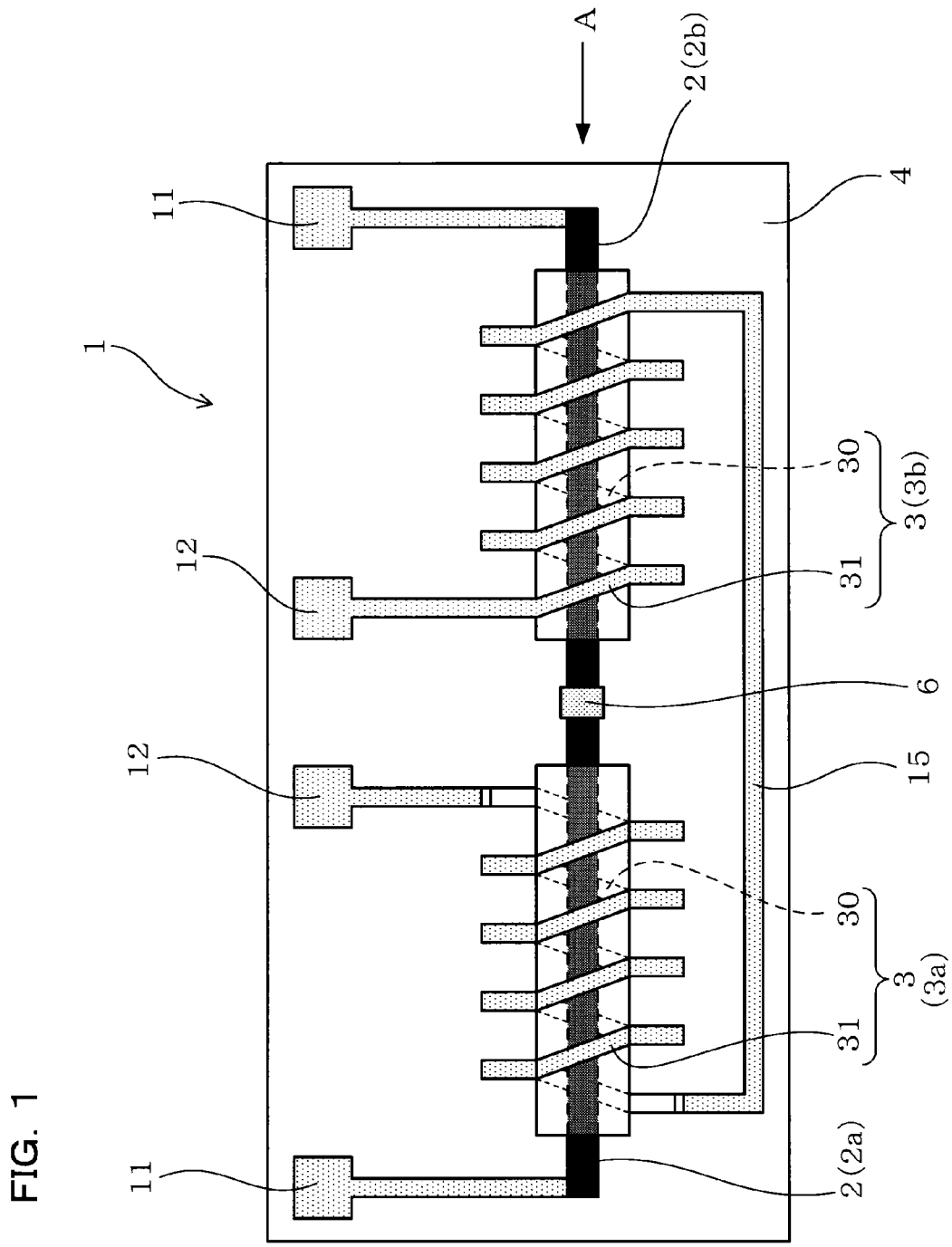
FIG. 1 is a plan view showing a magneto-impedance sensor element in Example 1.
Figure 2:
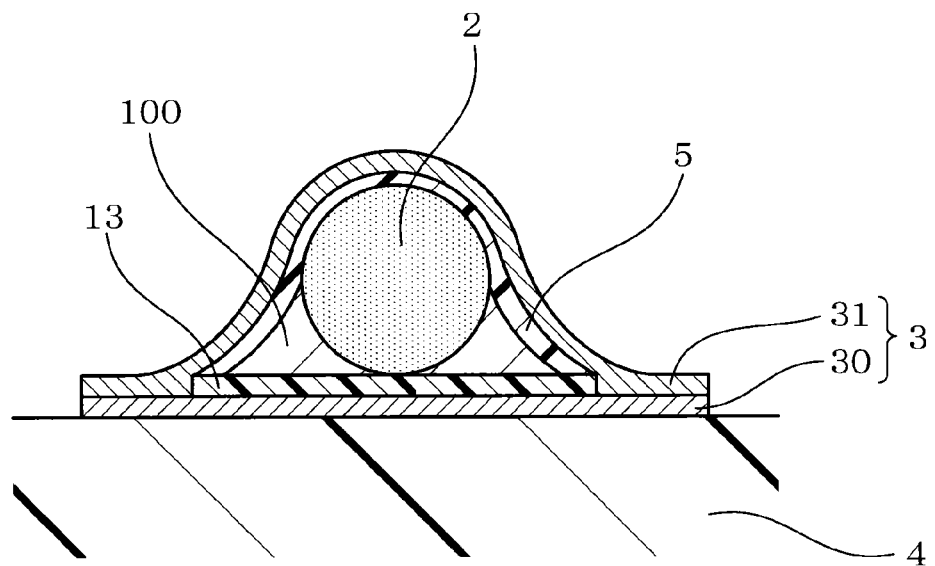
FIG. 2 is a view from the direction of arrow A in FIG. 1.

Magneto-impedance sensor elements according to Example of the present invention will be explained using FIGS. 1 to 11. As shown in FIGS. 1 and 2, an MI sensor element 1 of the present Example includes a substrate 4 formed of a non-magnetic material, a plurality of magneto-sensitive bodies 2 (2a and 2b), and a plurality of detecting coils 3 (3a and 3b).

The magneto-sensitive body 2 is formed of an amorphous material, and is fixed on the substrate 4. The plurality of magneto-sensitive bodies 2 are electrically connected to each other.

Also, the detecting coils 3 are formed by wounding around each magneto-sensitive body 2, and are electrically connected to each other.

The MI sensor element 1 is configured so that a voltage corresponding to a magnetic field strength acting on the magneto-sensitive body 2 is output from the detecting coil 3 by flowing a pulse current or a high-frequency current to the magneto-sensitive body 2.

The plurality of magneto-sensitive bodies 2 are formed by fixing one amorphous wire 20 on the substrate 4, and then cutting the wire.

Detailed explanations are follows:

The magneto-sensitive body 2 according to the Example is formed of a CoFeSiB alloy, and has a length of 0.3 mm and a diameter of 0.01 mm. As shown in FIGS. 1 and 2, an insulator 5 formed from $SiO_2$ or the like is formed around the magneto-sensitive body 2, and the detecting coil 3 is formed around this insulator 5. The detecting coil 3 is formed of a metal such as copper. The detecting coil 3 has a plane pattern 30 formed on a principal plane of the substrate 4, and a three-dimensional pattern 31 formed on a surface of the insulator 5. As shown in FIG. 2, the three-dimensional pattern 31 is insulated from the magneto-sensitive body 2 by the insulator 5. An insulating film 13 lies between the plane pattern 30 and the magneto-sensitive body 2 for insulating them.

As shown in FIG. 1, two magneto-sensitive bodies 2 (2a and 2b) are connected in series to each other through a wire junction 6. Also, terminals 11 for wire are connected to the magneto-sensitive bodies 2 at its edges.

On the other hand, in the present Example, the detecting coils 3 (3a and 3b), which are respectively formed around the magneto-sensitive bodies 2 (2a and 2b), are connected in series through a coil junction 15. Terminals 12 for coil are connected to the detecting coils 3.

When pulse current or high-frequency current is made to flow from the terminals 11 for wire to the magneto-sensitive bodies 2, an output voltage corresponding to a magnetic field strength acting on the magneto-sensitive bodies 2 is generated in the detecting coils 3. The magnetic field strength can be measured by measuring this output voltage.

Figure 3:
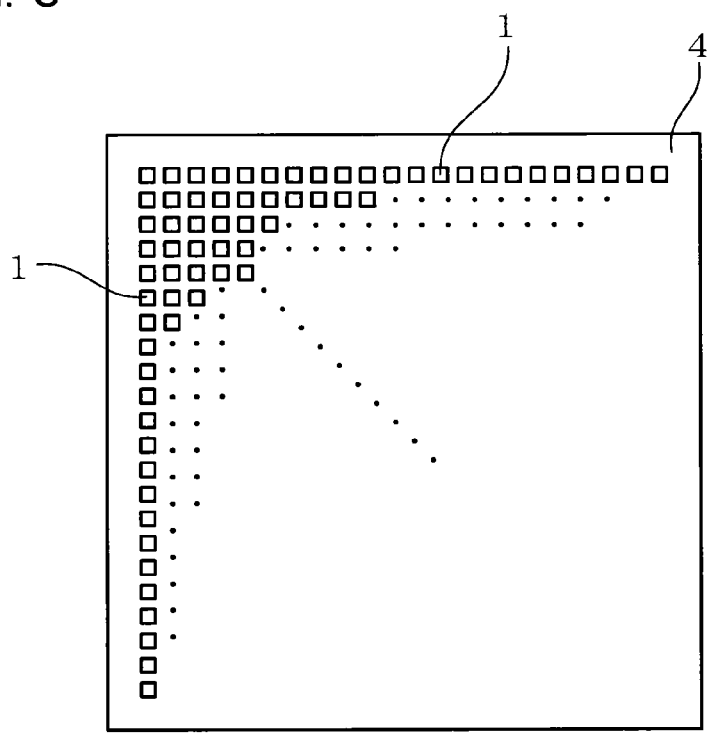
FIG. 3 is a general view for explaining a method for producing the magneto-impedance sensor element in Example 1.

Next, a method for producing the MI sensor element 1 will be explained. According to the present Example, as shown in FIG. 3, the plurality of MI sensor elements 1 are simultaneously formed on the substrate 4, and dicing is performed between the MI sensor elements 1 to divide them. The plurality of MI sensor elements 1 are produced at once by this method.

Figure 4:
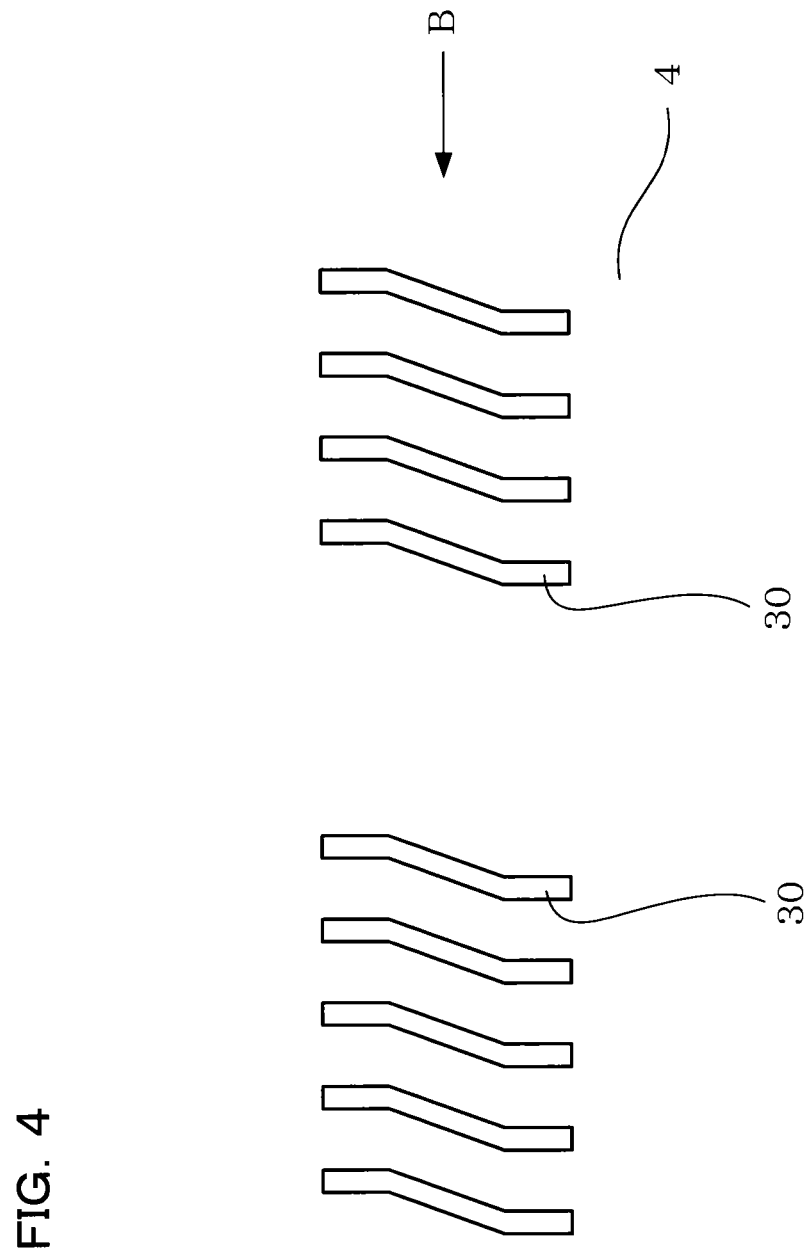
FIG. 4 is a plan view for explaining the method for producing the magneto-impedance sensor element in Example 1.
Figure 5:
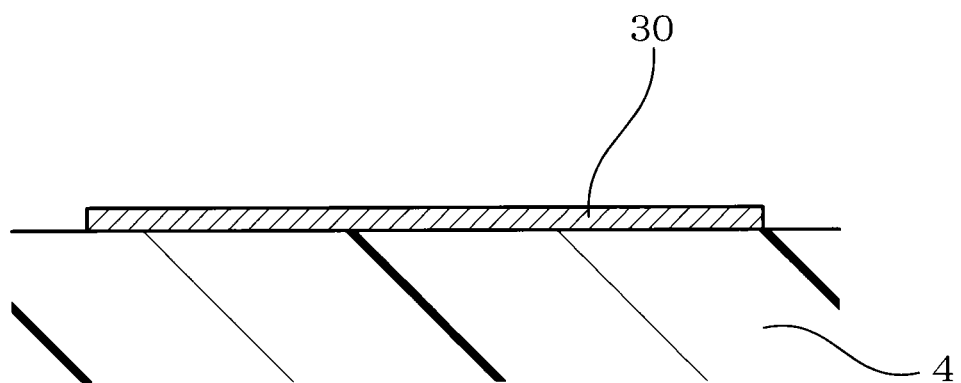
FIG. 5 is a view from the direction of arrow B in FIG. 4.

The method for producing the MI sensor element 1 will be explained in detail. As shown in FIGS. 4 and 5, first, plane patterns 30 are formed. This plane pattern 30 can be produced by two kinds of methods as explained below. According to the first method, a thin lower part Ti/Cu seed layer having a thickness of 0.1 μm is formed on a planation surface of the substrate 4, on which a resist is put, and patterning including an exposure step and a developing step is performed, in order to form a plurality of conducting films which are arranged in a pre-determined state. Next, after a copper plating treatment is performed and the resist is removed, the lower part Ti/Cu seed layer is removed by selective etching.

According to the second method, a Cu layer is formed on the planation surface of the substrate 4, on which the resist is put, and patterning including the exposure step and the developing step is performed, in order to form the plurality of conducting films which are arranged in the pre-determined state. Next, the Cu layer is removed by etching, and then the resist is removed to form the plane pattern 30.

Figure 6:
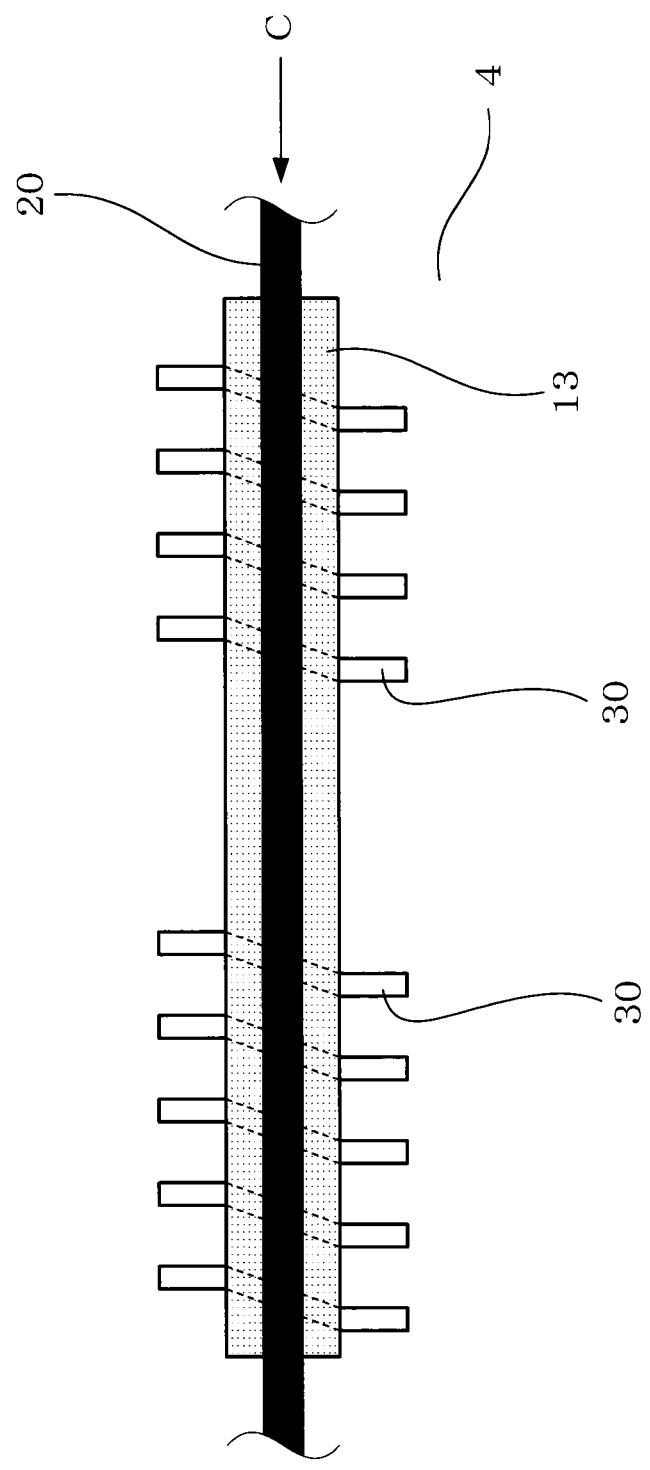
FIG. 6 is a view continuing from FIG. 4.
Figure 7:
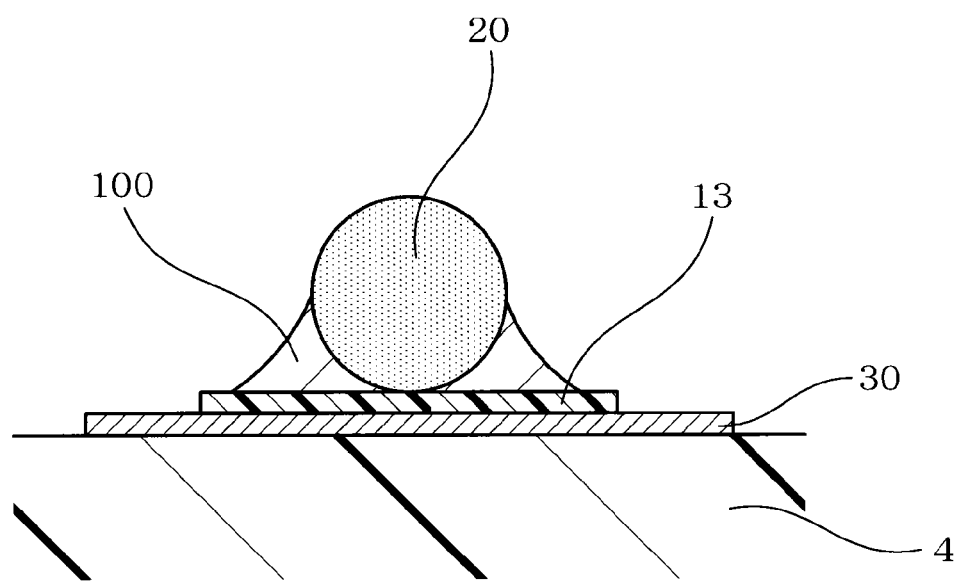
FIG. 7 is a view from the direction of arrow C in FIG. 6.

After that, as shown in FIGS. 6 and 7, the insulating coating film 13 having a thickness of 2 μm is formed from a photosensitive epoxy resin on an upper surface of the plane pattern 30. This insulating coating film 13 covers a central part of the plane pattern 30, and both ends of the plane pattern 30 are exposed therefrom.

Subsequently, as shown in FIGS. 6 and 7, an amorphous wire 20 is fixed on the insulating coating film 13 by dripping a liquid epoxy resin, which has been diluted with a solvent (a fixing step of the present invention). After the solvent is fixed, baking is performed at 100° C. for about 30 minutes, whereby the fixing of the amorphous wire 20 on the insulating coating film 13 is completed. The epoxy resin is solidified to form the wire fixing part 100. Here, as described above, in the present Example, the plurality of MI sensor elements 1 are formed on the substrate 4, for improving the efficiency of the production (see FIG. 3). In order to realize it, the sufficiently long amorphous wire 20 is positioned so that the plurality of MI sensor elements 1 can be formed at once. Also in the present Example, the amorphous wire 20 is fixed on the insulating coating film 13 in a state in which the wire is linearly placed.

Figure 8:
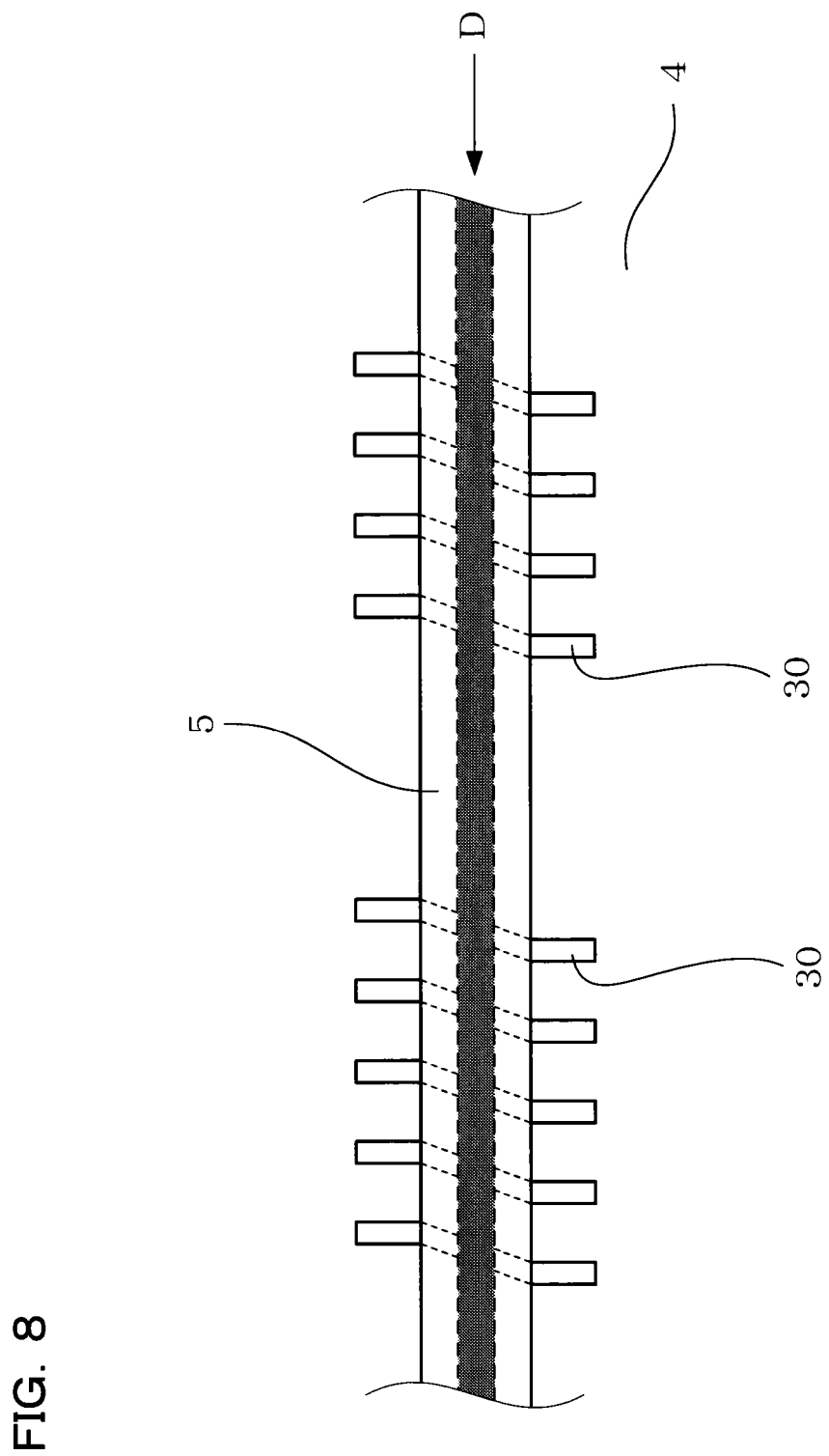
FIG. 8 is a view continuing from FIG. 6.
Figure 9:
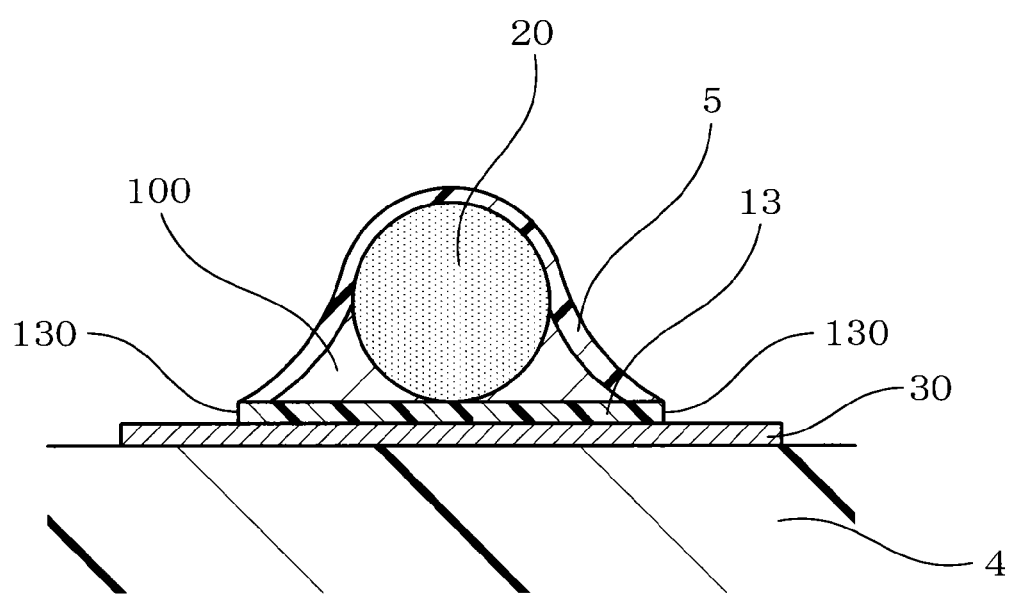
FIG. 9 is a view from the direction of arrow D in FIG. 8.

Next, as shown in FIGS. 8 and 9, the insulator 5, which covers a surface of the amorphous wire 20, is formed from a photosensitive epoxy resin in the same manner as in the fixing step. As shown in FIG. 9, the cross-sectional shape of the insulator 5 is in a bell-bottomed shape in which the thickness thereof becomes gradually thinner toward an edge 130 of the insulating coating film 13 from the amorphous wire 20. Also, both edges of the plane pattern 30 are not covered with the insulator 5 but exposed therefrom. Here, the fixing step and the step of forming the insulator 5 may be simultaneously performed, thus resulting in integral formation. This can make the production procedure easy, and thus more efficient production can be performed.

Figure 10:
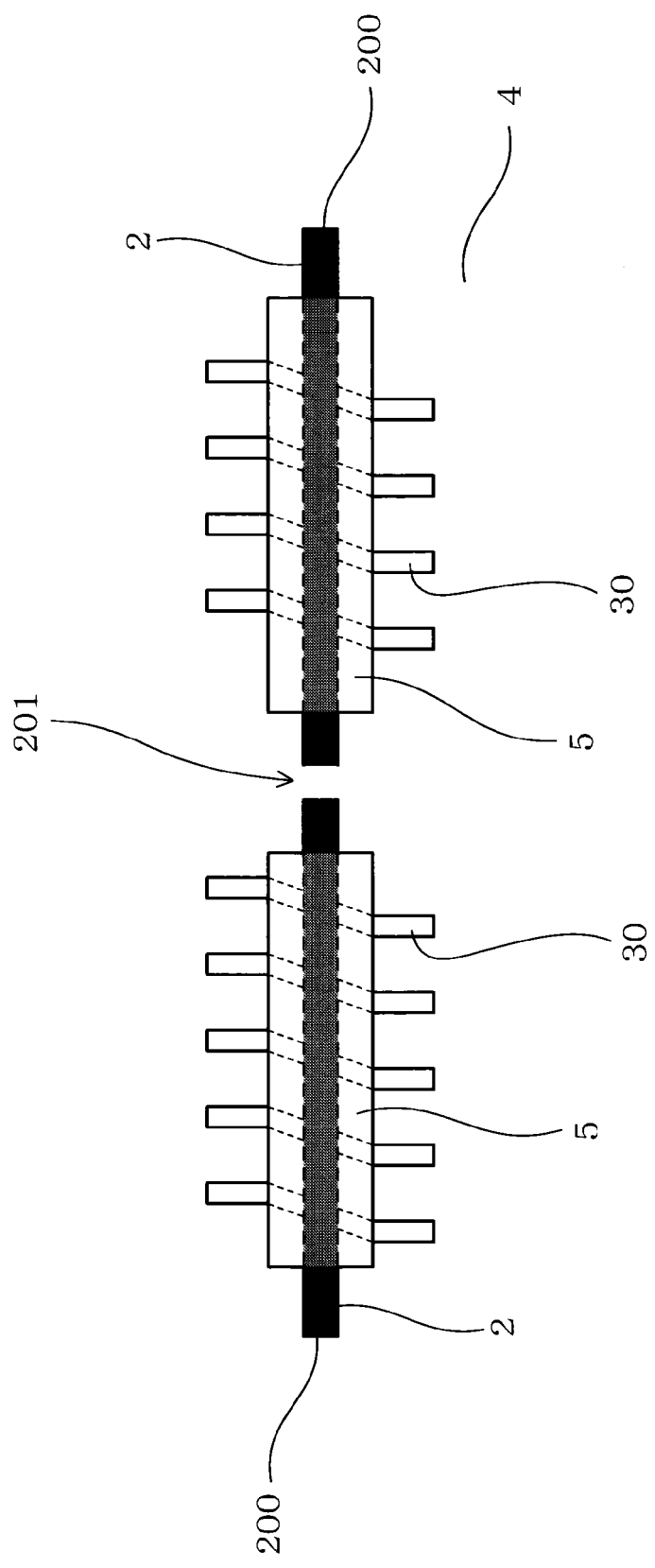
FIG. 10 is a view continuing from FIG. 8.

After that, as shown in FIG. 10, the insulator 5 is cut by etching into a pre-determined length. In this case, an agent incapable of etching the amorphous wire 20 is used. Then, both edges 200 of the amorphous wire 20 and a central part 201 are cut by etching (a cutting step of the present invention). By this method, the plurality of magneto-sensitive bodies 2 are formed.

As described above, in the present Example, one amorphous wire 20 is fixed on the substrate 4 while it is maintained in a linear state, and the wire is cut by etching while the state is maintained. As a result of cutting, accordingly, the plurality of magneto-sensitive bodies 2 obtained are, needless to say, each in a linear state.

For cutting the wire, a cutting method using a laser or a cutting method using a cutter may be adopted, other than the etching.

Next, a metal thin film is deposited on a whole surface of the substrate 4, and the metal thin film is selectively etched, thereby forming the three-dimensional pattern 31, the terminals 11 for wire, the terminals 12 for coil, the coil junction 15 and the wire junction 6, as shown in FIGS. 1 and 2. The plurality of magneto-sensitive bodies 2 are electrically connected by this wire junction 6 (a connecting step of the present invention). In addition, both edges of the three-dimensional pattern 31 and the plane pattern 30 are electrically connected to each other. The detecting coil 3 is formed from the three-dimensional pattern 31 and the plane pattern 30.

The plurality of MI sensor elements 1 are simultaneously formed on the substrate 4 by performing the steps as explained above (see FIG. 3). After that, dicing is performed between the MI sensor elements 1 to divide them.

Next, the effects of the present Example will be explained. As shown in FIGS. 6 to 10, according to the method for producing the magneto-impedance sensor element 1 of the present Example, the above-mentioned fixing step, cutting step and connecting step are performed.

In doing this way, the plurality of magneto-sensitive bodies 2 can be formed using adjacent parts to each other in one amorphous wire 20. As a result, the properties of the plurality of magneto-sensitive bodies 2 in one MI sensor element 1 can be made almost the same. This can provide an effect in which sensitivity almost the same as the theoretical value can be obtained.

In the present Example, after the amorphous wire 20 is fixed on the substrate 4, cutting is performed while the position in the fixed state is maintained. Therefore, all of the magneto-sensitive bodies 2 can easily be arranged in the same direction, and can be made in parallel. According to the present invention, the plurality of magneto-sensitive bodies are electrically connected, and the detecting coils, each of which is wound around each magneto-sensitive body, are connected to each other, whereby a structure in which components having the same direction of the magnetism can be measured by a plurality of magneto-sensitive bodies is formed. It is necessary, therefore, that all of the magneto-sensitive bodies are completely arranged in the same direction. As described above, however, they can easily be arranged in the same direction, and thus the measuring accuracy of magnetism can be greatly increased.

Further in the present Example, each magneto-sensitive body 2 can be formed in a linear state, and thus the measuring accuracy of magnetism can be further increased.

According to the present Example, as shown in FIG. 3, the plurality of MI sensor elements 1 are formed using one amorphous wire 20, and thus the variation in the property among the plurality of the MI sensor elements 1 can be decreased.

In the MI sensor element 1 produced using the production method described above, the amorphous wire 20 is fixed on the substrate 4 and then the wire is cut to form the plurality of magneto-sensitive bodies 2. Therefore, the magneto-sensitive bodies 2 can be formed using adjacent parts to each other in the amorphous wire 20. As a result, the properties of the plurality of magneto-sensitive bodies 2 in one MI sensor element 1 are, accordingly, almost the same.

In addition, in the MI sensor element 1 produced using the production method described above, the amorphous wire 20 is fixed on the substrate 4 and then the wire is cut, and thus the magneto-sensitive bodies 2 are arranged in the same position and direction, and positioning is performed in an exactly parallel state, at the time when the wire 20 is fixed on the substrate 4. Accordingly, after that, by electrical connection while the positions are maintained, the MI sensor element 1 having no variation in the direction among all magneto-sensitive bodies 2 at all can be easily and efficiently produced. Thus, the measuring accuracy of magnetism can be increased.

As shown in FIG. 1, in the present Example, the plurality of detecting coils 3 are connected in series to each other.

FIG. 11 shows examination results of relationships between a magnitude of external magnetic field and an output voltage when the wire length is varied from 0.6 to 1.5 mm, in a case in which the amorphous wire using a CoFeSiB alloy and having a diameter of 30 μm is used as the magneto-sensitive body 2, and a coil inner-diameter of the detecting coil is set at 80 μm. As shown in this graph, when the length L of the magneto-sensitive body 2 is long in an axis line direction, the output voltage is saturated even at a weak magnetic field. For example, when the length L=1.5 mm, the output voltage is saturated at a magnetic field of ±10 G. It is difficult, accordingly, to measure magnetic fields of more than ±10 G.

In order to solve this problem, it can be considered to shorten the length L of the magneto-sensitive body 2. When the length L is shortened, as shown in FIG. 11, it is hard to saturate the output voltage due to the increased diamagnetizing field generated inside the magneto-sensitive body 2, and thus it becomes possible to detect a strong magnetic field. For example, in the magneto-sensitive body 2 having L=0.6 mm, an output voltage is not saturated up to ±40 G.

When the length of the magneto-sensitive body 2 in the axis line direction is shortened, however, a problem of decreased output voltage is raised.

This problem can be solved by connecting the plurality of detecting coils 3 in series, as shown in FIG. 1, to increase the output voltage, whereby a strong magnetic field can be measure, and the MI sensor element 1 having a high output voltage can be obtained.

In the present Example, for simplification of explanation, a case in which two magneto-sensitive bodies are used and two detecting coils are connected in series in FIGS. 1 and 10 is explained, but, needless to say, the present invention is not limited to the case shown in FIGS. 1 and 10. It is possible to design an optimized specification depending on the magnetic field environment to be actually measured. It is also possible, needless to say, to perform production in a specification in which three or more magneto-sensitive bodies are used and three or more detecting coils are connected in series.

The plurality of detecting coils 3 may be connected in parallel, though the case is not shown in drawings. In such a case, noise generated in the detecting coil 3 can be decreased. A defect in which the output voltage is hidden in noise, therefore, can be prevented, and it becomes possible to detect the magnetic field in a high accuracy.

As described above, the present Example can provide a method for producing the magneto-impedance element having a high measuring accuracy of magnetism in a high producibility, and the magneto-impedance element produced by the production method.

Example 2

Figure 12:
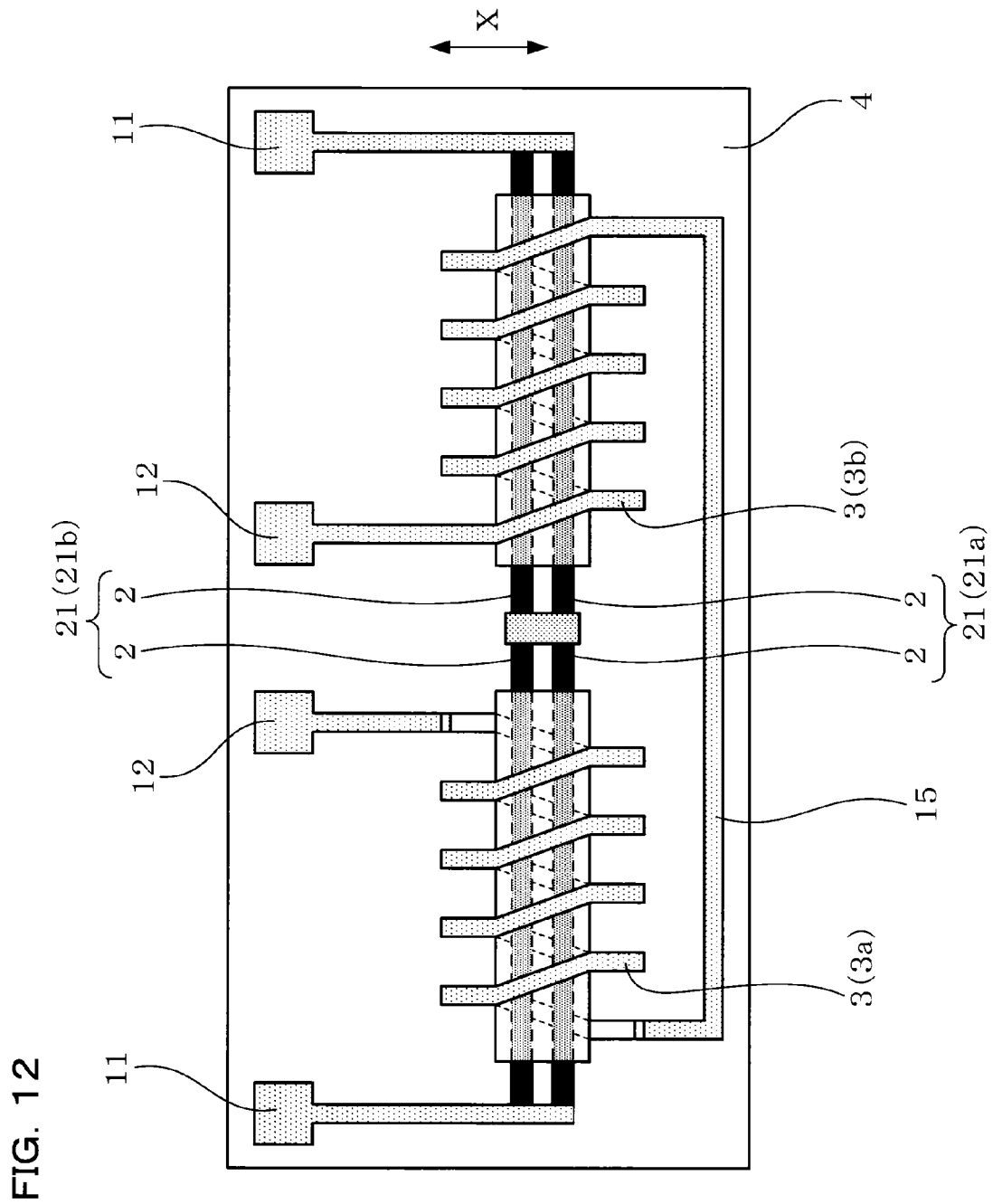
FIG. 12 is a plan view showing a magneto-impedance sensor element in Example 2.
Figure 13:
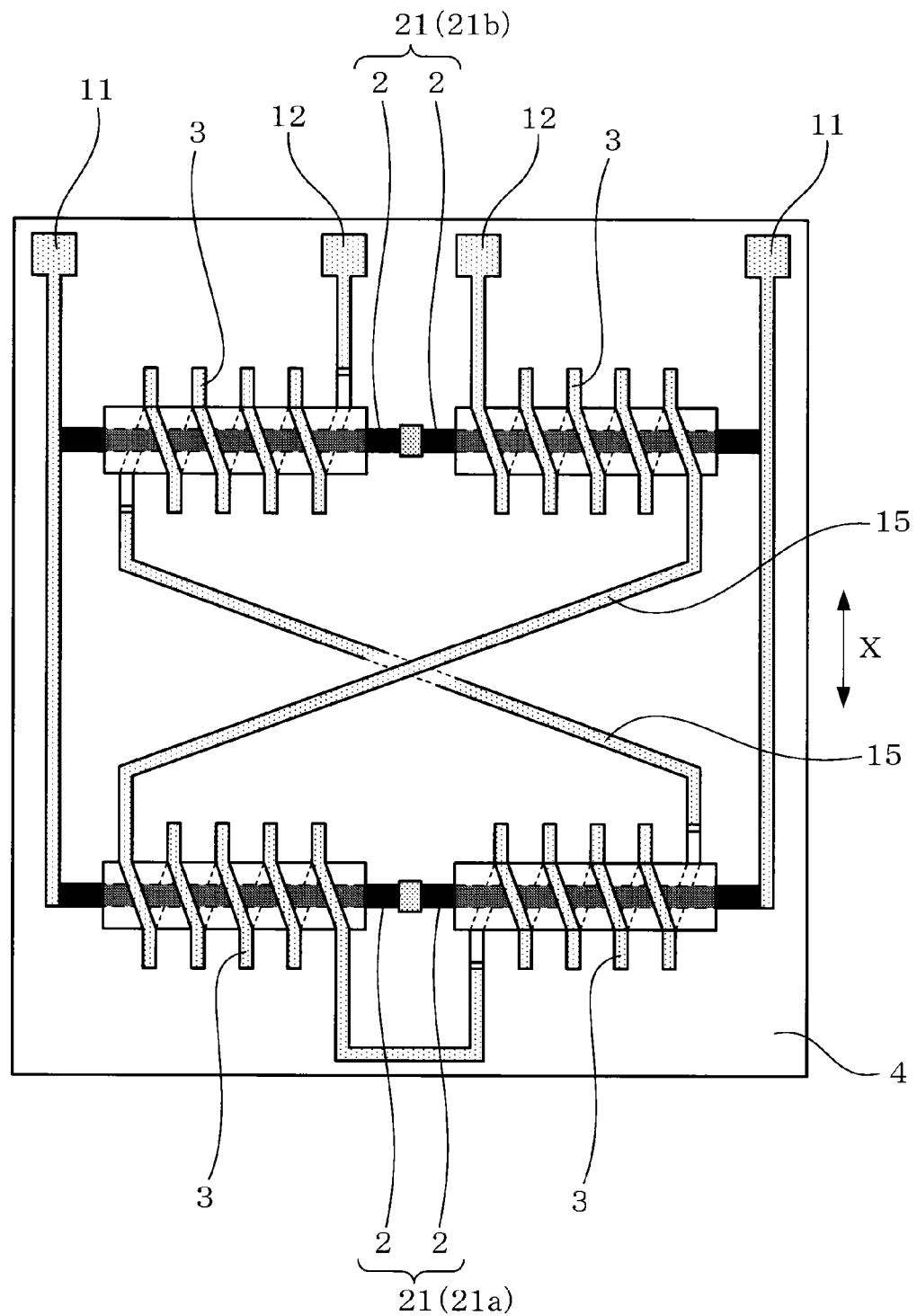
FIG. 13 is a plan view showing a magneto-impedance sensor element in Example 3.
Figure 14:
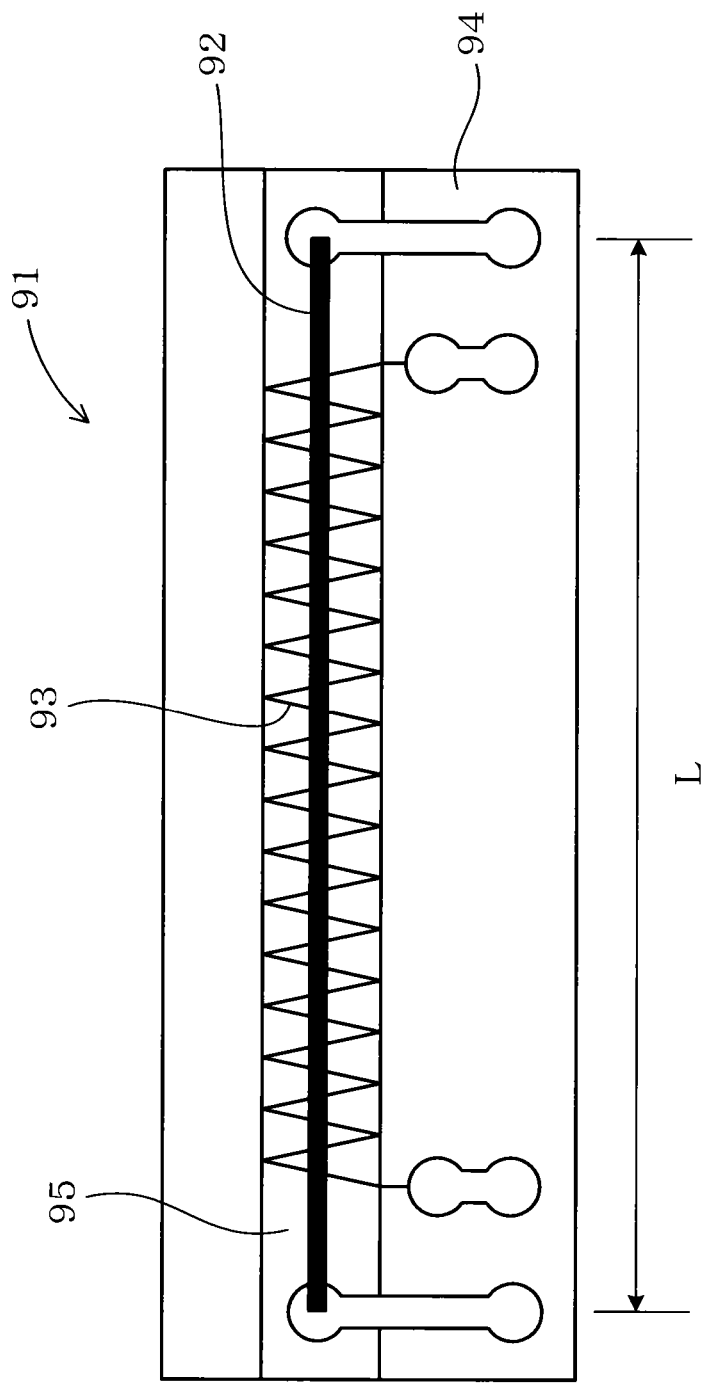
FIG. 14 is a plan view showing a magneto-impedance sensor element in prior art.
Figure 15:
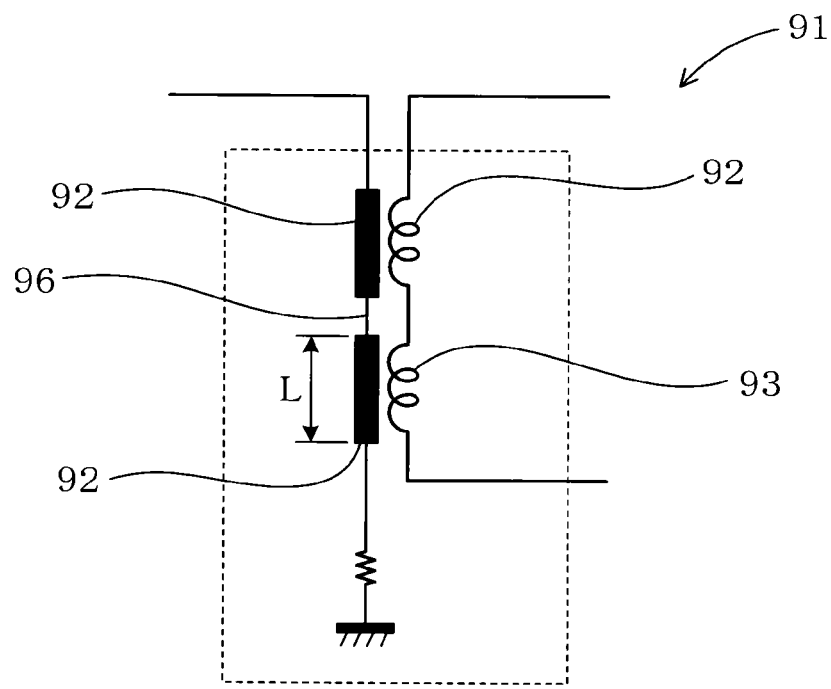
FIG. 15 is a circuit diagram of the magneto-impedance sensor element in prior art.
Figure 16:
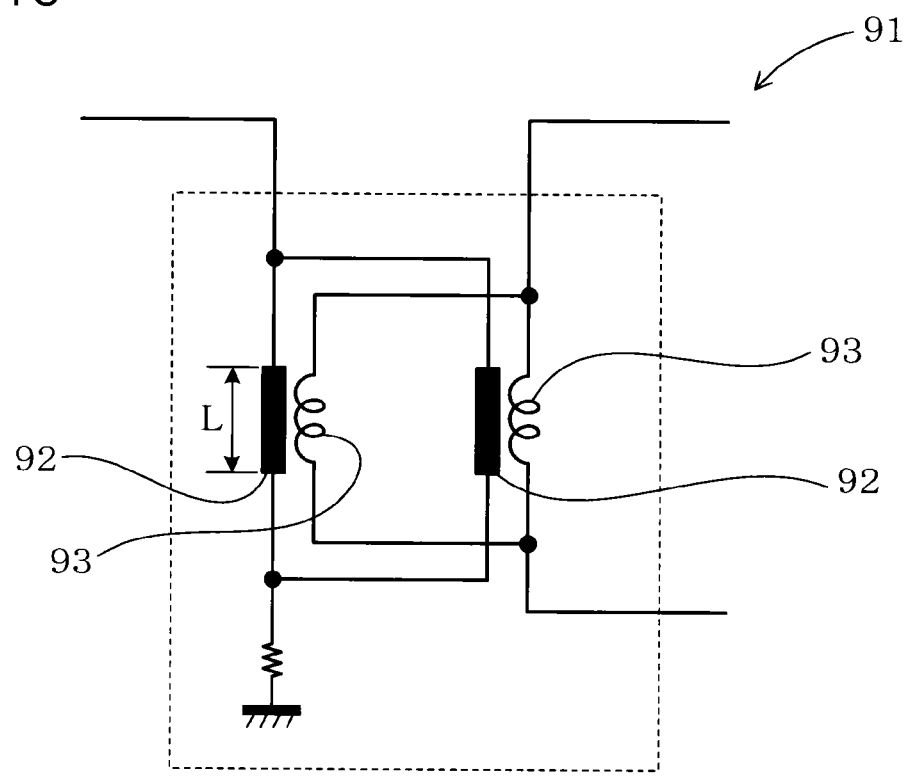
FIG. 16 is a circuit diagram of a magneto-impedance sensor element in prior art, which is different from that in FIG. 15.

The present Example is an example in which the number of magneto-sensitive bodies 21 is changed. As shown in FIG. 12, an MI sensor element 1 in the present Example has a magneto-sensitive body group 21 (21a) including a plurality of magneto-sensitive bodies 2, which are formed by cutting one amorphous wire 20 and are positioned in parallel to an axis line direction. The MI sensor element 1 also has the magneto-sensitive body group 21 (21b) formed by cutting the amorphous wire 20, which is different from the amorphous wire 20 used for forming the magneto-sensitive body group 21a. These groups 21a and 21b of the plurality of magneto-sensitive bodies are positioned adjacent to each other in a radial direction X. One detecting coil 3 is wound around the plurality of magneto-sensitive bodies 2, which are adjacent to each other in the radial direction X.

One detecting coil 3a is connected to other detecting coil 3b in series through a coil junction 15.

Other components are the same as in Example 1.

The structure described above can provide a high output voltage, because the plurality of magneto-sensitive bodies 2 can be contained in one detecting coil 3. In addition, the distance between the magneto-sensitive bodies 2, which are positioned adjacent to each other in the radial direction X can be shortened, and thus the same output voltage can be obtained from further miniaturized the MI sensor element 1.

In addition, the element has the same effects as obtained in Example 1.

Example 3

The present Example is an example in which the number and the position of magneto-sensitive bodies 21 are changed.

The MI sensor element 1 in the present Example has a magneto-sensitive body group 21 (21a) including a plurality of magneto-sensitive bodies 2, which are formed by cutting one amorphous wire 20 and are positioned in parallel to an axis line direction. The MI sensor element also has a magneto-sensitive body group 21 (21b) formed by cutting the amorphous wire 20, which is different from the amorphous wire 20 used for forming the magneto-sensitive body group 21a. These groups 21a and 21b of the plurality of magneto-sensitive bodies are positioned adjacent to each other in a radial direction X. A detecting coil 3 is wound around each magneto-sensitive body 2. The plurality of detecting coils 3 are connected to each other in series through the coil junctions 15.

Other components are the same as in Example 1.

Effects in the present Example will be explained. The magneto-sensitive bodies 2 can be positioned adjacent to each other not only the axis line direction but also in the radial direction X by the structure described above, and thus more magneto-sensitive bodies 2 can be formed in one MI sensor element 1. When the detecting coils 3 are connected in series, the output voltage can be further increased, and thus a high output voltage can be obtained by a smaller MI sensor element.

In this Example, four magneto-sensitive bodies and four detecting coils are each connected in series, but, needless to say, further more magneto-sensitive bodies can be used and much more detecting coils can be connected to each other in series. In addition, the combination of series connection and parallel connection may be adopted. When the numbers of the magneto-sensitive bodies and the detecting coils used are suitably adjusted in combination with an aspect ratio of the wire described above, a measurable range of a magnetic field can be adjusted, or an MI element can be designed by adjusting an output voltage to produce it, even to measure the same magnitude of the magnetic field. The MI sensor element, accordingly, has a great effect in which an optimal MI element can easily be designed depending on the magnetic field environment which is wanted to be measured by users.

When the plurality of detecting coils 3 are connected in parallel, though the case is not shown in drawings, noise can be further decreased.

In addition, the element has the same effects as obtained in Example 1.

The invention claimed is:

1. A method for producing a magneto-impedance sensor element, wherein the magneto-impedance sensor element includes a substrate formed from a non-magnetic material,
a plurality of magneto-sensitive bodies, which are formed from an amorphous material, are fixed on the substrate, and are electrically connected to each other, and
a plurality of detecting coils, each of which is wound around each of the magneto-sensitive bodies, and which are electrically connected to each other,
the magneto-impedance sensor element being configured to output a voltage corresponding to a magnetic field strength acting on the magneto-sensitive bodies from the detecting coils by flowing a pulse current or high-frequency current to the magneto-sensitive bodies,
the method for producing the magneto-impedance sensor element comprising:
a fixing step in which an amorphous wire is fixed on the substrate;
a cutting step in which the amorphous wire is cut to divide it in an axis line direction, thereby forming the plurality of magneto-sensitive bodies; and a connecting step in which the plurality of magneto-sensitive bodies are electrically connected to each other.

2. A magneto-impedance sensor element comprising:
a substrate formed from a non-magnetic material;
a plurality of magneto-sensitive bodies, which are formed from an amorphous material, are fixed on the substrate, and are electrically connected to each other; and
a plurality of detecting coils, each of which is wound around each of the magneto-sensitive bodies, and which are electrically connected to each other,
wherein the magneto-impedance sensor element is configured to output a voltage corresponding to a magnetic field strength acting on the magneto-sensitive bodies from the detecting coils by flowing a pulse current or high-frequency current to the magneto-sensitive bodies,
in which a plurality of magneto-sensitive bodies are formed by fixing one amorphous wire on the substrate, and then cutting the amorphous wire.

3. The magneto-impedance sensor element according to claim 2, wherein a plurality of detecting coils are connected in series to each other.

4. The magneto-impedance sensor element according to claim 2, wherein a plurality of detecting coils are connected in parallel to each other.

5. The magneto-impedance sensor element according to any one of claims 2 to 4, wherein several magneto-sensitive body groups including a plurality of magneto-sensitive bodies, which are formed by cutting the one amorphous wire, and which are positioned in parallel to the axis line direction, are positioned adjacent to each other in a radial direction, and the one detecting coil is wound around a plurality of magneto-sensitive bodies, which are adjacent to each other in a radial direction.

6. The magneto-impedance sensor element according to any of claims 2 to 4, wherein several magneto-sensitive body groups including a plurality of magneto-sensitive bodies, which are formed by cutting the one amorphous wire, and which are positioned in parallel to the axis line direction, are positioned adjacent to each other in a radial direction, and each of the detecting coil is wound around each of the magneto-sensitive bodies.

* * * * *